(12) United States Patent
Jimarez et al.

(10) Patent No.: US 6,818,972 B2
(45) Date of Patent: Nov. 16, 2004

(54) REDUCTION OF CHIP CARRIER FLEXING DURING THERMAL CYCLING

(75) Inventors: Lisa J. Jimarez, Newark Valley, NY (US); Miguel A. Jimarez, Newark Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 23 days.

(21) Appl. No.: 10/262,023

(22) Filed: Sep. 30, 2002

(65) Prior Publication Data

US 2003/0034566 A1 Feb. 20, 2003

Related U.S. Application Data

(60) Division of application No. 09/691,935, filed on Oct. 19, 2000, now Pat. No. 6,528,179, which is a continuation-in-part of application No. 09/503,395, filed on Feb. 14, 2000, now Pat. No. 6,497,943.

(51) Int. Cl.$^7$ .................... H01L 23/495; H01L 23/48; H01L 23/52; H01L 29/40
(52) U.S. Cl. ............... 257/674; 257/668; 257/669; 257/746; 257/747
(58) Field of Search ........................ 257/747, 778, 257/737, 738, 701, 702, 674, 668, 669, 746

(56) References Cited

U.S. PATENT DOCUMENTS

| | | | |
|---|---|---|---|
| 5,136,470 A | * | 8/1992 | Sheridon et al. ............ 361/749 |
| 5,450,286 A | * | 9/1995 | Jacques et al. ............. 361/749 |
| 5,571,608 A | * | 11/1996 | Swamy ....................... 428/137 |
| 5,760,465 A | * | 6/1998 | Alcoe et al. ................ 257/669 |
| 5,773,884 A | * | 6/1998 | Andros et al. .............. 257/707 |
| 5,877,043 A | * | 3/1999 | Alcoe et al. ................ 438/123 |
| 5,987,742 A | * | 11/1999 | Acciai et al. ................ 29/846 |
| 6,014,317 A | * | 1/2000 | Sylvester .................... 361/760 |
| 6,027,590 A | * | 2/2000 | Sylvester et al. ........... 156/150 |
| 6,528,179 B1 | * | 3/2003 | Jimarez et al. ............. 428/620 |

FOREIGN PATENT DOCUMENTS

JP          11-274736      * 10/1999      ............. 3/46

OTHER PUBLICATIONS

Japanese Patent Publication No. 11–274736 Japanese Patent Office Computer Translation, Oct. 8, 1999, Shinada et al., 21 pages.*
Multi–Layer Substrate with Low Coefficent of Thermal Expansion, Nakamura et al., 2000 International Symposium on Microelect, pp. 235–240.

* cited by examiner

Primary Examiner—Nathan J. Flynn
Assistant Examiner—Victor A. Mandala, Jr.
(74) Attorney, Agent, or Firm—Schmeiser, Olsen & Watts; William H. Steinberg

(57) ABSTRACT

A method and structure for reducing chip carrier flexing during thermal cycling. A semiconductor chip is coupled to a stiff chip carrier (i.e., a chip carrier having an elastic modulus of at least about $3 \times 10^5$ psi), and there is no stiffener ring on a periphery of the chip carrier. Without the stiffener ring, the chip carrier is able to undergo natural flexing (in contrast with constrained flexing) in response to a temperature change that induces thermal strains due to a mismatch in coefficient of thermal expansion between the chip and the chip carrier. If the temperature at the chip carrier changes from room temperature to a temperature of about −40° C., a maximum thermally induced displacement of a surface of the chip carrier is at least about 25% less if the stiffener ring is absent than if the stiffener ring is present. Since a propensity for cracking of the stiff chip carrier increases as the thermally induced displacement increases, the present invention, which avoids use of the stiffener ring, improves a structural integrity of the chip carrier.

20 Claims, 10 Drawing Sheets

REDUCTION OF CHIP CARRIER FLEXING DURING THERMAL CYCLING

This application is a divisional of Ser. No. 09/691,935, filed on Oct. 19, 2000, now U.S. Pat. No. 6,528,179 which is a continuation-in-part of Ser. No. 09/503,395, filed on Feb. 14, 2000 now U.S. Pat. No. 6,497,943.

BACKGROUND OF THE INVENTION

1. Technical Field

The present invention relates to a method and structure for reducing chip carrier flexing during thermal cycling.

2. Related Art

A semiconductor chip may be mechanically and conductively coupled to a chip carrier by having conductive contacts on the chip (e.g., Controlled Collapse Chip Connection solder balls) solderably coupled to the top surface of the chip carrier. During processing steps that elevate the temperature of the chip carrier, such as during a reflow step for solderably joining the chip to the chip carrier, a spatial distribution of coefficient of thermal expansion (CTE) due to material inhomogeneities within the chip carrier may cause the chip carrier to bow (or flex) upward or downward and thus deviate from planarity. For example, there may be large copper pads on the bottom of the chip carrier to accommodate a ball grid array of solder balls for coupling the chip carrier to a circuit card, and smaller amounts of copper, such as in the form of copper circuitization and/or copper pads for joining a chip to the chip carrier on the top surface of the chip carrier. The spatial distribution of CTE, and consequent bowing or sagging of the chip carrier when the chip carrier is heated, is a result of copper imbalance between the top and bottom surfaces of the chip carrier combined with volumetric distribution within the chip carrier of materials having different magnitudes of CTE.

The preceding chip carrier flexing problem increases in severity if the chip carrier is made of compliant material, such as compliant organic material which cannot be easily handled (e.g., a material having an elastic modulus of less than about 300,000 psi). An organic chip carrier that is highly compliant may benefit from a rigid "stiffener ring" bonded to an outer perimeter of the top surface of the chip carrier in order to enhance the structural characteristics of the chip carrier. That is, the stiffener ring makes the chip carrier more mechanically stable and thus easier to handle. Unfortunately, the stiffener ring acts as a mechanical clamp on the outer perimeter of the chip carrier that constrains outer portions of the chip carrier from expanding, particularly when subjected to elevated temperature. In contrast, center portions of chip carrier at which chips are typically attached, are not constrained by the stiffener ring. Thus, expansion of the central portions, when heated, accentuates the chip carrier bowing by causing a distinct upward bulge in the central portion of the chip carrier top surface.

An adverse consequence of chip carrier bowing, particularly when a stiffener ring is used with a compliant organic chip carrier, is unreliable coupling of a chip to the chip carrier, as illustrated in FIGS. 1 and 2. FIG. 1 shows a semiconductor chip 10 resting on an organic chip carrier 20 at ambient room temperature, wherein a top surface 14 of the chip carrier 20 is flat, and wherein solder balls 11, 12, and 13 on the semiconductor chip 10 are in conductive contact with solder bumps 24, 25, and 26 at the conductive pads 17, 18, and 19 on the top surface 14 of the chip carrier 20, respectively. A stiffener ring 15 is bonded to the outer perimeter of the chip carrier 20 by an interfacing adhesive 16. FIG. 2 shows the chip carrier 20 of FIG. 1 under temperature elevation, such as when solder from the solder bumps 24, 25, and 26 is reflowed around the solder balls 11, 12, and 13 in an attempt to conductively join the solder balls 11, 12, and 13 to the conductive pads 17, 18, and 19, respectively. At the elevated temperature, the center the chip carrier 20 is bows (or bulges) upward in the direction 22, such that the solder balls 11 and 13 are no longer in conductive contact with the conductive pads 17 and 19, respectively. Thus, the chip carrier flexing impairs the ability to reliably join a chip to a chip carrier. The bowing B may exceed 2 to 3 mils during solder reflow.

A method and structure is needed for reducing or eliminating flexing of a compliant organic chip carrier in an elevated temperature environment, and particularly when solder is reflowed around solder balls of a semiconductor chip for joining the semiconductor chip to the chip carrier.

The related art does not teach or suggest how to reduce flexing of a stiff chip carrier during thermal cycling. As a result, a stiff chip carrier may experience flexing that leads to cracking during thermal cycling.

A method and structure is therefore needed for reducing chip carrier flexing during thermal cycling.

SUMMARY OF THE INVENTION

The present invention provides an electronic structure, comprising:

a chip carrier having an elastic modulus of at least about $3\times10^5$ psi, wherein there is no stiffener ring coupled to a peripheral portion of the chip carrier; and a semiconductor chip coupled to a central portion of the chip carrier.

The present invention provides a method of forming an electronic structure, comprising:

providing a chip carrier having an elastic modulus of at least about $3\times10^5$ psi, wherein there is no stiffener ring coupled to a peripheral portion of the chip carrier; and coupling a semiconductor chip to a central portion of the chip carrier.

The present invention improves an ability of a stiff chip carrier to accommodate stresses thermally induced in the chip carrier during thermal in order to reduce or eliminate flexing of the chip carrier during the thermal cycling.

DETAILED DESCRIPTION OF THE INVENTION

The detailed description herein discusses and teaches: 1) surface metal balancing to reduce or eliminate thermally induced chip carrier flexing; and 2) stiff chip carriers without stiffener rings to reduce chip carrier flexing of stiff chip carriers during thermal cycling.

Surface Metal Balancing

Figure 3:
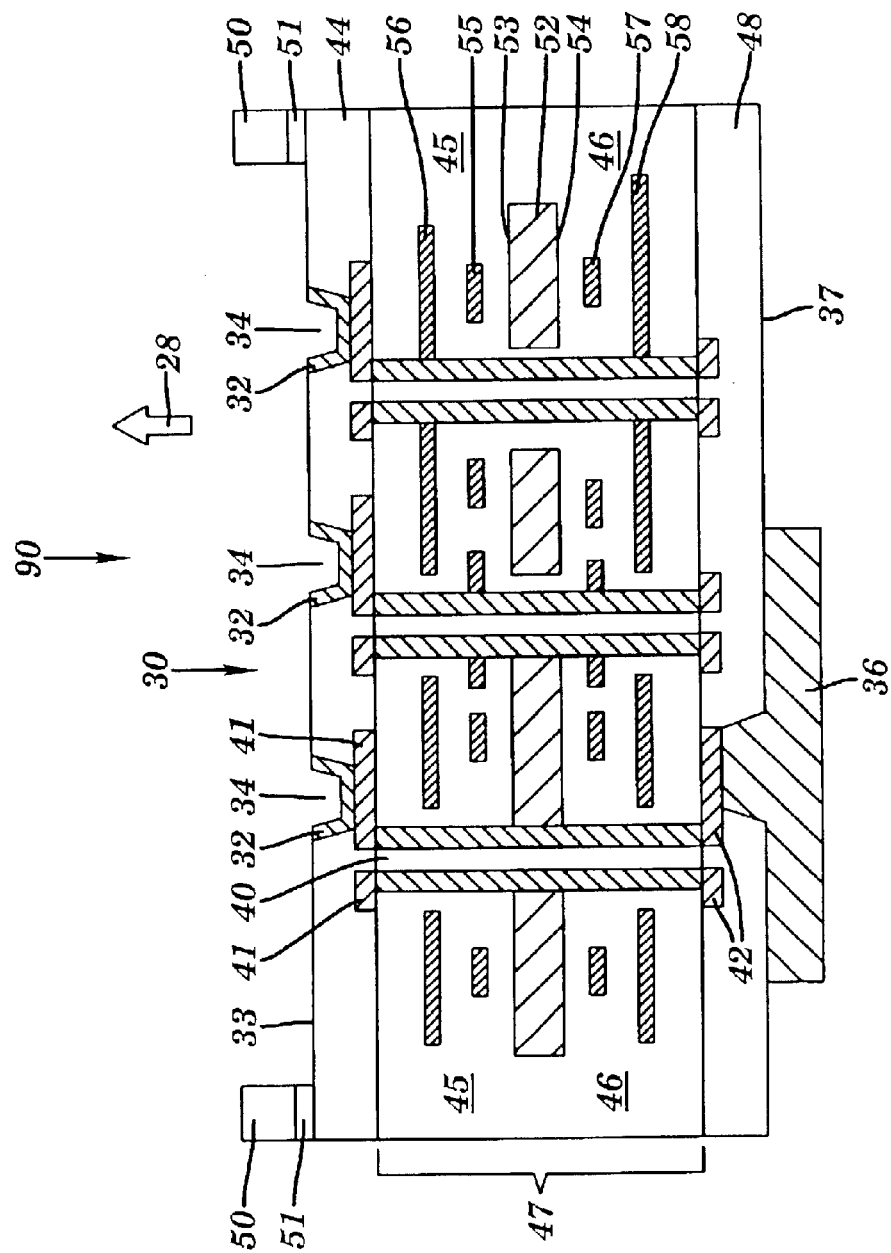
FIG. 3 depicts a front cross-sectional view of an organic substrate having first and second metal structures on top and bottom surfaces, respectively, of the organic substrate, in accordance with a embodiments of the present invention.

FIG. 3 illustrates a front cross-sectional view of an electronic structure 90 comprising an organic substrate 30 that includes an organic material, a metal structure 32 on a top surface 33 of the organic substrate 30, and a metal structure 36 on a bottom surface 33 of the organic substrate 30, in accordance with embodiments of the present invention. The metal structure 32 may include a metal plating (e.g., such as a copper plating) on at least one plated blind via 34, and any conductive circuitization (not shown) on the top surface 33. The plating on the plated blind via 34 is intended to be conductively coupled to an electronic device, such as the semiconductor chip 76 shown infra in FIG. 12. The metal structure 36 may include metal pads, such as ball grid array (BGA) pads (see, e.g., FIG. 4 for an illustration of BGA pads), and any conductive circuitization (not shown) on the bottom surface 37. BGA pads are intended to be conductively coupled to an electronic assembly such as a circuit card. The metal structure 32 and the metal structure 36 may be conductively coupled by any internal conductive structure within the organic substrate 30, such as a plated though hole (PTH) 40, together with a metal pad 41 conductively interfacing the metal structure 32 with the PTH 40, and a metal pad 42 conductively interfacing the metal structure 36 with the PTH 40. Many other internal conductive structures are possible. For example, the metal structure 32 could each be conductively coupled to a first plated blind extending into an interior level of the organic substrate 30, the metal structure 36 could be conductively coupled to into a second plated blind extending into the interior level, such that the first and second blind vias are coupled by interfacing conductive circuitization at the interior level.

FIG. 3 shows the organic substrate 30 as comprising four dielectric layers: dielectric layer 44 denoted as a top layer that is included within the top surface 33, dielectric layer 48 denoted as a bottom layer that is included within the bottom surface 37, and dielectric layers 45 and 46 within a region 47, wherein the region 47 interfaces with dielectric layers 44 and 48. The region 47 (which comprises dielectric layers 45 and 46 as stated supra) includes the organic dielectric material. Additionally, the region 47 includes a thermally conductive layer 52 with the dielectric layers 45 and 46 on opposing surfaces 53 and 54, respectively, of the thermally conductive layer 52. The dielectric layer 45 includes a signal plane 55 and a power plane 56, wherein the signal plane 55 is positioned between the thermally conductive layer 52 and the power plane 56. A power plane comprises a continuous sheet of conductive material (e.g., copper) having at least one through hole. A signal plane comprises a layer of shielded signal conductors. The dielectric layer 46 includes a signal plane 57 and a power plane 58, wherein the signal plane 57 is positioned between the thermally conductive layer 52 and the power plane 58.

The dielectric layers 44 and 48 each have a thickness preferably between about 40 microns and about 60 microns. The dielectric layers 44 and 48 provide a structural stability to the substrate 30, inasmuch as the organic material in the dielectric layers 45 and 46 is soft compliant and thus may be difficult to handle in an absence of the more rigid dielectric layers 44 and 48. Additionally, the dielectric layers 44 and 48 each preferably include a dielectric material having a CTE that by no more than a factor of about 3 as the temperature increases from just below to just above the glass transition temperature ($T_g$) of the dielectric material of the dielectric layers 44 and 48. In contrast, other materials that could be used in the dielectric layers 44 and 48 generally have a CTE that increases by an order of magnitude or more as the temperature in increased through a $T_g$ transition. A preferred dielectric material for the dielectric layers 44 and 48 includes a resin having an allylated polyphenylene ether (APPE) having $T_g$ of about 210° C. and characterized by a CTE increase of a factor of about 2.5 as the temperature increases from just below to just above $T_g$. A particularly useful APPE for the dielectric layers 44 and 48 is an APPE resin coated on a copper foil, made by the Asahi Chemical Company of Japan and identified as Asahi product number PC5103.

Notwithstanding the dielectric layers 44 and 48, the substrate 30 remains somewhat compliant, and its structural stability may be further enhanced with a stiffener ring 50 bonded to an outer portion, such as an outer perimeter portion as shown in FIG. 3, of the top surface 33 of the organic substrate 30 by use of an interfacing adhesive 51. In order to avoid or minimize differential thermal expansion between the stiffener ring 50 and the organic substrate 30, the CTE of the stiffener ring 50 should preferably not differ by more than about 10% from the spatially average CTE of a composite structure of: the organic substrate 30, the dielectric layer 44, and the dielectric layer 48. The thermally conductive layer 52 preferably has a coefficient of thermal expansion (CTE) between about 4 ppm/° C. and about 8 ppm/° C., such that a spatially averaged CTE of said composite structure is between about 10 ppm/° C. and about 12 ppm/° C. If the organic substrate 30 has a spatially averaged CTE between about 10 ppm/° C. and about 12 ppm/° C., a suitable material for the stiffener ring 50 is, inter alia, 430 series stainless steel having a CTE of 10.0 ppm/° C.

The dielectric layers 45 and 46 may be laminated to the thermally conductive layer 52 by, inter alia, placing the layers 45 and 46 on the opposing surfaces 53 and 54 of the thermally conductive layer 52, to form a sandwich with the thermally conductive layer 52 as a middle layer of the sandwich. A pressure is applied to the sandwich, such as by using a lamination press. The pressure is between about 1000 psi and about 2000 psi at a temperature between about 305° C. and about 400° C. The PTH 40, which passes through the region 47, may be formed by, inter alia, laser or mechanical drilling to form a via. A thin (e.g., 1 to 3 microns) metal (e.g., copper) is electrolessly plated on the via wall, using a seeding material such as palladium to promote electroless adhesion of the metal to the via wall. Then a thicker (e.g., 1 mil) layer of the metal (e.g., copper) is electroplated over the electroless coat of the metal. Note that other metal plating techniques, known to one of ordinary skill in the art, may be used.

The dielectric layers 44 and 48 may be laminated on the dielectric layers 45 and 46, respectively, by any method known to one of ordinary skill in the art, in accordance with the particular dielectric material used in the dielectric layers 44 and 48. For example, the dielectric layers 44 and 48, if including the allylated polyphenylene ether (APPE) coated on a copper foil such as the Asahi resin PC5103, may be formed on the dielectric layers 45 and 46, respectively, by pressurization in a range of about 1000 psi to about 2000 psi at an elevated temperature between about 180° C. and about 210° C. for a time of at least about 90 minutes. The pressurization and elevated temperatures causes the APPE resin to flow and become cured, resulting in lamination of the the dielectric layers 44 and 48 to the dielectric layers 45 and 46, respectively. After the pressurization, the copper foils are removed in any manner known to one of ordinary skill in the art, such as by etching.

The plated blind via 34 may be formed by any method known to one of ordinary skill in the art, such as by laser drilling into the dielectric layer 44 down to the metal pad 41 to form a via, followed by electroless plating of metal (e.g., copper) on seeded surfaces (e.g., palladium seeded surfaces) of the via to form an electroless layer of the metal. After the electroless plating, the metal (e.g., copper) is electroplated over the electroless layer to form the plated blind via 34.

For definitional purposes, let $C_1$ and $A_1$ denote the CTE and surface area of the metal structure 32, respectively. Let $C_2$ and $A_2$ denote the CTE and surface area of the metal structure 36, respectively. The values of $C_1$, $A_1$, $C_2$, and $A_2$ are at ambient room temperature. It is assumed that $C_2A_2$ exceeds $C_1A_1$. Under the preceding assumption and upon a heating of the substrate 30, the top surface 33 will bow (or bulge) upward in a direction 28, due to a thermal expansion imbalance between metalizations of the metal structure 32 and the metal structure 36 in consideration of the stiffener ring 50, as explained supra in the "Related Arts" section.

The organic structure 30 in FIG. 3 is illustrative and many other alternative structures are within the scope of the present invention. For example, the structure 30 may have any number of dielectric layers, including as few as one dielectric layer. As another example, any of the thermally conductive layer 52, the signal planes 55 and 57, and the power planes 56 and 58 may or may not be present. It should be further noted that words such as "top," "bottom," "up," and "down," do not imply a directional orientation with respect to a radial direction from a center of the Earth, but rather serve to orient the reader in viewing the Figures in this patent application.

Figure 4:
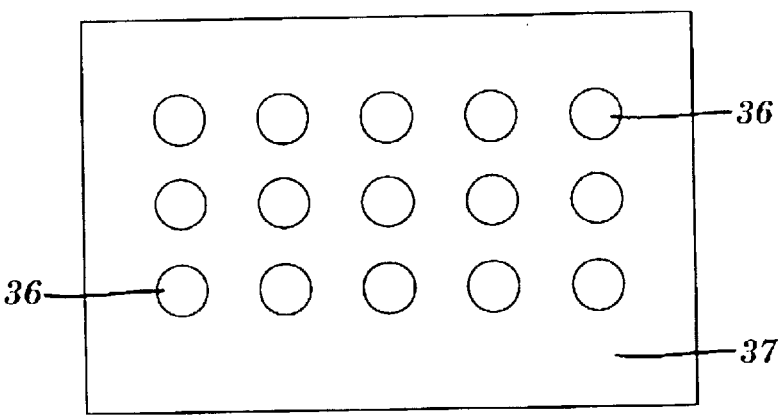
FIG. 4 depicts a bottom view of the organic substrate of FIG. 3, showing BGA pads illustrating the second metal structure on a bottom surface of the substrate.

FIG. 4 shows a bottom view of the organic substrate 30 of FIG. 3, showing BGA pads illustrating the second metal structure 36 on the bottom surface 37 of the organic substrate 30. Each of the 15 BGA pads of the second metal structure 36 in FIG. 4 is intended to contact a BGA solder ball for coupling the organic substrate 30 to a circuit card.

Note that the BGA pad pattern in FIG. 4 is an example of the second metal structure 36. Any geometric configuration of metal on the bottom surface 37 of the organic substrate 30 may represent the second metal structure 36.

Figure 5:
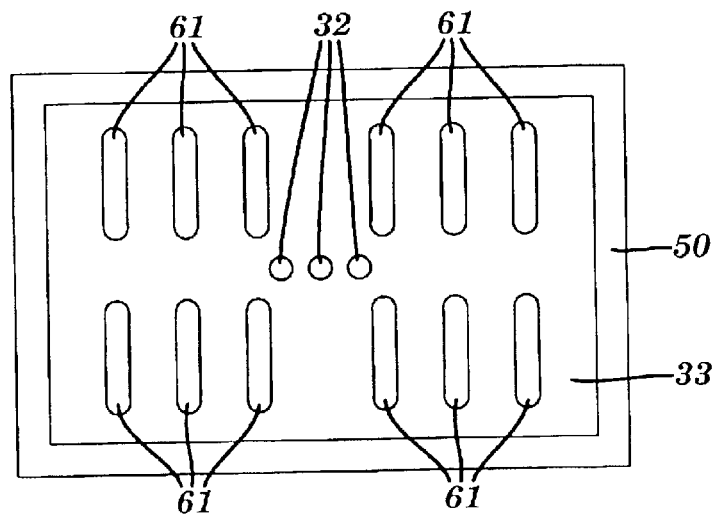
FIG. 5 depicts a top view of the organic substrate of FIG. 3, showing the first metal structure with a first metal pattern coupled to a top surface of the substrate.

FIG. 5 illustrates a top view of the organic substrate 30 of FIG. 3, along with the stiffener ring 50, showing a metal pattern 61 coupled to unoccupied space at or adjacent to (see discussion following description of FIGS. 9–11 for a definition of "adjacent to") the top surface 33, in order to compensate for an imbalance between $C_1A_1$ (of the top surface 33) and $C_2A_2$ (of the bottom surface 37). In particular, the metal pattern 61 has a CTE and surface area of $C_3$ and $A_3$, respectively, such that $(C_2A_2-C_1A_1-C_3A_3)$ is less than $(C_2A_2-C_1A_1)$ in magnitude. The values of $C_3$ and $A_3$ are at ambient room temperature. Thus, the metal pattern 61 compensates partially or fully for a thermal imbalance between $C_1A_1$ and $C_2A_2$. $C_2A_2$ and $(C_3A_3+C_1A_1)$ should differ in magnitude by no more than about 20%, and preferably by no more than about 10%. Note that if $C_1$, $C_2$, and $C_3$ are about equal, then the preceding condition takes the form of having $A_2$ and $(A_3+A_1)$ differ in magnitude by no more than about 20%, and preferably by no more than about 10%. If the first metal structure 32, the second metal structure 36, and the metal pattern 61 are each comprised of the same metal, then $C_1$, $C_2$, and $C_3$ are about equal. Nonetheless, the first metal structure 32, the second metal structure 36, and the metal pattern 61 may include different metals, and $C_1$, $C_2$, and $C_3$ may accordingly differ. Copper, which has a CTE of about 17 ppm/° C., is a preferred metal for the metal pattern 61. Other metal suitable for the metal pattern 61 include nickel, which has a CTE of about 17 or 18 ppm/° C., and aluminum, which has a CTE of about 20 ppm/° C.

The thicknesses of the first metal structure 32, the second metal structure 36, and the metal pattern 61 are preferably comparable, and deviations in thickness within about 10% will not significantly impact the effectiveness of the thermal balancing scheme described supra. If said thickness deviations exceed about 10%, then the surface exposed $A_3$ of the metal pattern 61 may be adjusted to deviate from the preceding formula of balancing $(A_3C_3+A_1C_1)$ against $A_2C_2$, to whatever extent is necessary for achieving a desired level of thermal balancing. Said adjusting of $A_3$ may be accomplished by testing, and without undue experimentation, by recognizing that a smaller thickness in the metal pattern 61 allows more thermal expansion length of the metal pattern 61 parallel to the top surface 33 of the organic substrate 30 than does a larger thickness, for a given surface area $A_3$. Thus, a thickness in the metal pattern 61 that is too large, which inhibits expansion parallel to the top surface 33, may be compensated for by increasing the surface area $A_3$.

The metal pattern 61 may be coupled to any unoccupied space at the top surface 33. The metal pattern 61 is insulatively isolated from any other conductive structure on or within the substrate 30. Thus, the metal pattern 61 has no electrical function, and serves the particularized function of balancing thermal expansion of metalization on the top and bottom surfaces 33 and 37, respectively, so as to reduce or eliminate flexing of the substrate 30 when subjected to an elevated temperature.

The effectiveness of the metal pattern 61 for thermal balancing purposes is insensitive to a spatial distribution of the metal pattern 61 on the top surface 33, provided that a combined spatial distribution of the metal pattern 61 and the metal structure 32 on the top surface 33 is not highly skewed in comparison with a spatial distribution of the metal structure 36 on the bottom surface 37.

Figure 6:
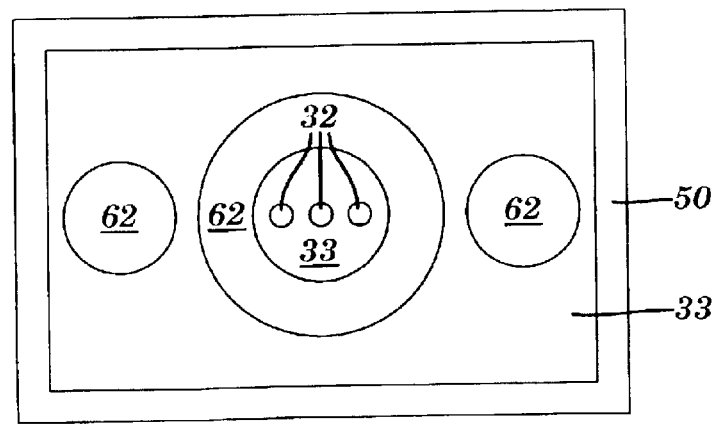
FIG. 6 depicts a top view of the organic substrate of FIG. 3, showing the first metal structure with a second metal pattern coupled to a top surface of the substrate.
Figure 7:
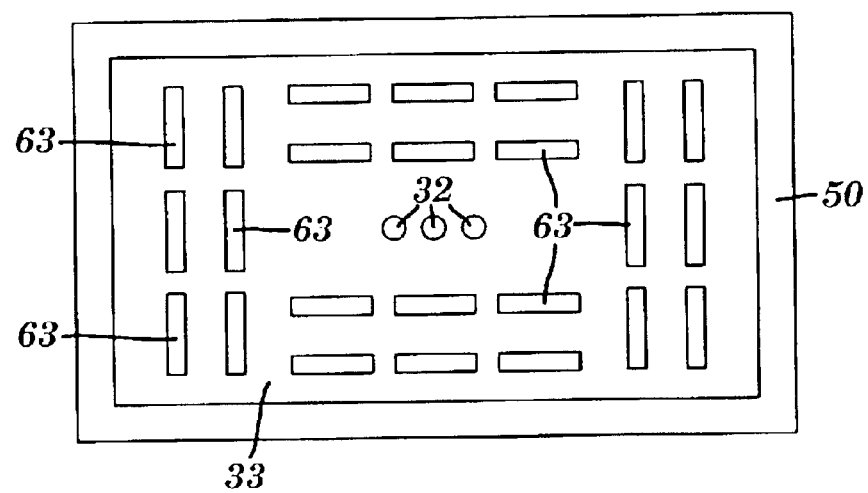
FIG. 7 depicts a top view of the organic substrate of FIG. 3, showing the first metal structure with a third metal pattern coupled to a top surface of the substrate.
Figure 8:
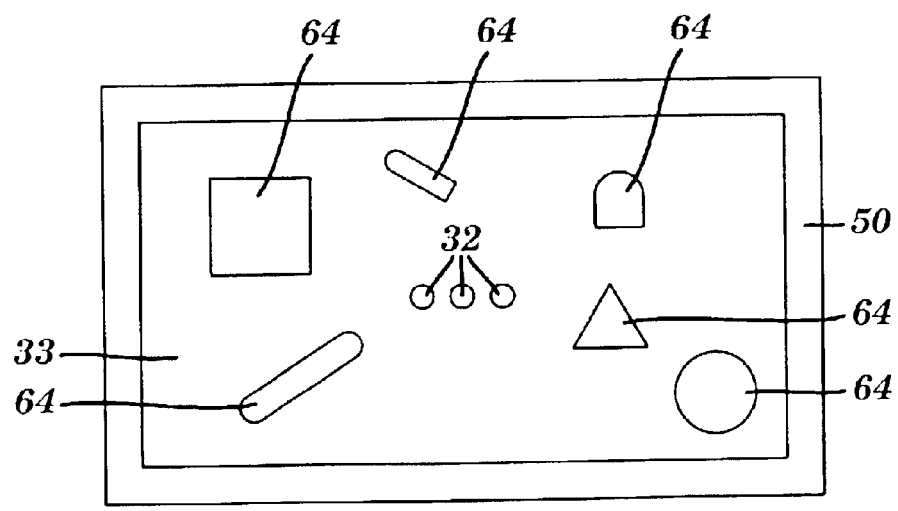
FIG. 8 depicts a top view of the organic substrate of FIG. 3, showing the first metal structure with a fourth metal pattern coupled to a top surface of the substrate.

The geometry of the metal pattern 61 is arbitrary, and metal of any geometry may be coupled to the top surface 33 to effectuate thermal balancing, provided that such metal is insulatively isolated from any other conductive structure on or within the substrate 30. Other examples of metal patterns that may be coupled to unoccupied space at or adjacent to (see discussion following description of FIGS. 9–11 for a definition of "adjacent to") the top surface 33 are shown in FIGS. 6, 7, and 8, namely metal patterns 62, 63, and 64, respectively. FIG. 6 shows the metal pattern 62 having a circular geometric arrangement. FIG. 7 shows the metal pattern 63 having a two-dimensional rectangular geometric arrangement. FIG. 8 shows the metal pattern 64 having a random geometric arrangement as to both shape and location.

Figure 9:
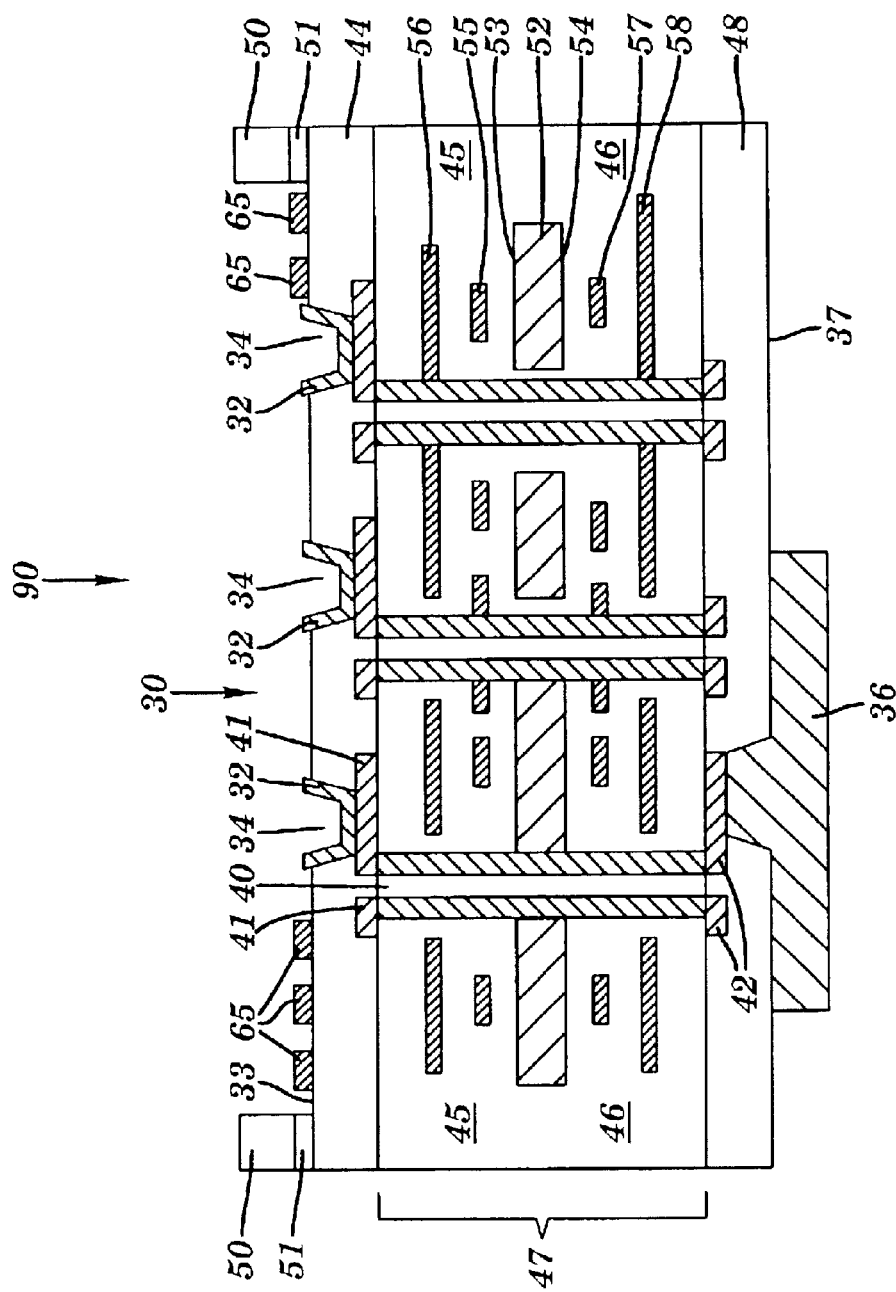
FIG. 9 depicts FIG. 3, showing a metal pattern coupled to, and above, the top surface of the substrate.
Figure 10:
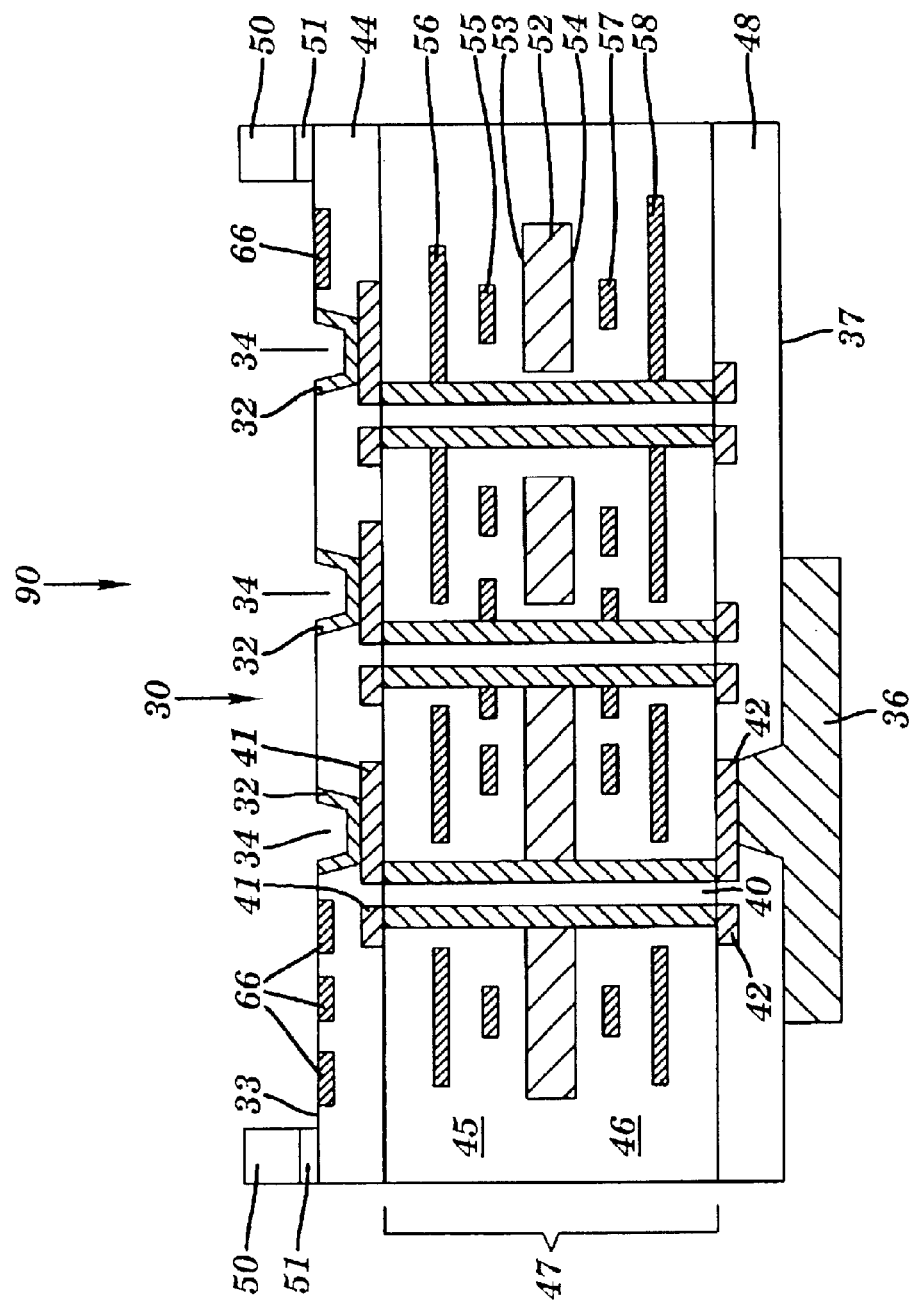
FIG. 10 depicts FIG. 3, showing a metal pattern coupled to, and below, the top surface of the substrate.

An insulatively metal pattern (e.g., any of the metal patterns 61, 62, 63, 64 in FIGS. 5–8, respectively) that is coupled to the top surface 33 of the organic substrate 30 for thermal balancing purposes, may be formed either above or below the top surface 33 as shown in FIGS. 9 and 10, respectively.

FIG. 9 illustrates FIG. 3, showing a metal pattern 65 above, and coupled to, the top surface 33 of the organic substrate 30. The metal pattern 65 may be formed by any method known to one of ordinary skill in the art. If metal such as copper is utilized for the metal pattern 61, for example, then the metal pattern 65 may be formed by: bonding a preformed sheet of the metal (e.g., copper) on the top surface 33, reducing the thickness of the preformed sheet of the metal to the desired thickness, applying photoresist and photolithographically exposing portions of the metal sheet to radiation (e.g., ultraviolet radiation), chemically developing away unexposed photoresist and the metal underneath the unexposed photoresist, and stripping away the exposed photoresist, such that the metal pattern 65 has been generated and is insulatively isolated from any other conductive structure on or within the substrate 30. If both the metal structure 32 and the metal pattern 65 each include the same metal (e.g., copper), then the metal pattern 65 may be formed concurrent with, and by the same process as, formation of circuitization associated with the metal structure 32 on the top surface 33, which would enable the metal pattern 65 to be formed at little or no extra cost inasmuch as the circuitization associated with the metal structure 32 would be formed regardless of whether the metal pattern 65 is also formed.

If nickel is utilized for the metal pattern 61, then the metal pattern 65 may be formed by electroplating or sputter deposition. The thickness of the metal pattern 61 may be reduced as needed by any method known to one of ordinary skill in the art.

If aluminum is utilized for the metal pattern 61, then the metal pattern 65 may be formed by the same method described supra for copper, except that the thickness of the preformed sheet of aluminum cannot be easily reduced. Thus, the preformed sheet of aluminum should have a thickness that is close to desired thickness of the metal pattern 61.

FIG. 10 illustrates FIG. 3, showing a metal pattern 66 below, and coupled to, the top surface 33 of the organic substrate 30. The metal pattern 66 may be formed by any method known to one of ordinary skill in the art, such as by laser-drilling isolated cavities (i.e., blind vias) in the dielectric layer 44, and filling the cavities with the metal (of the intended metal pattern 66) by electroless plating on seeded surfaces (e.g., palladium seeded surfaces) of the cavities, followed by electroplating the metal to fill the cavities to the level of the top surface 33. It should be noted that the metal pattern 66 could be formed concurrent with, and by the same process as, formation of plated blind vias 34 described supra.

Figure 11:
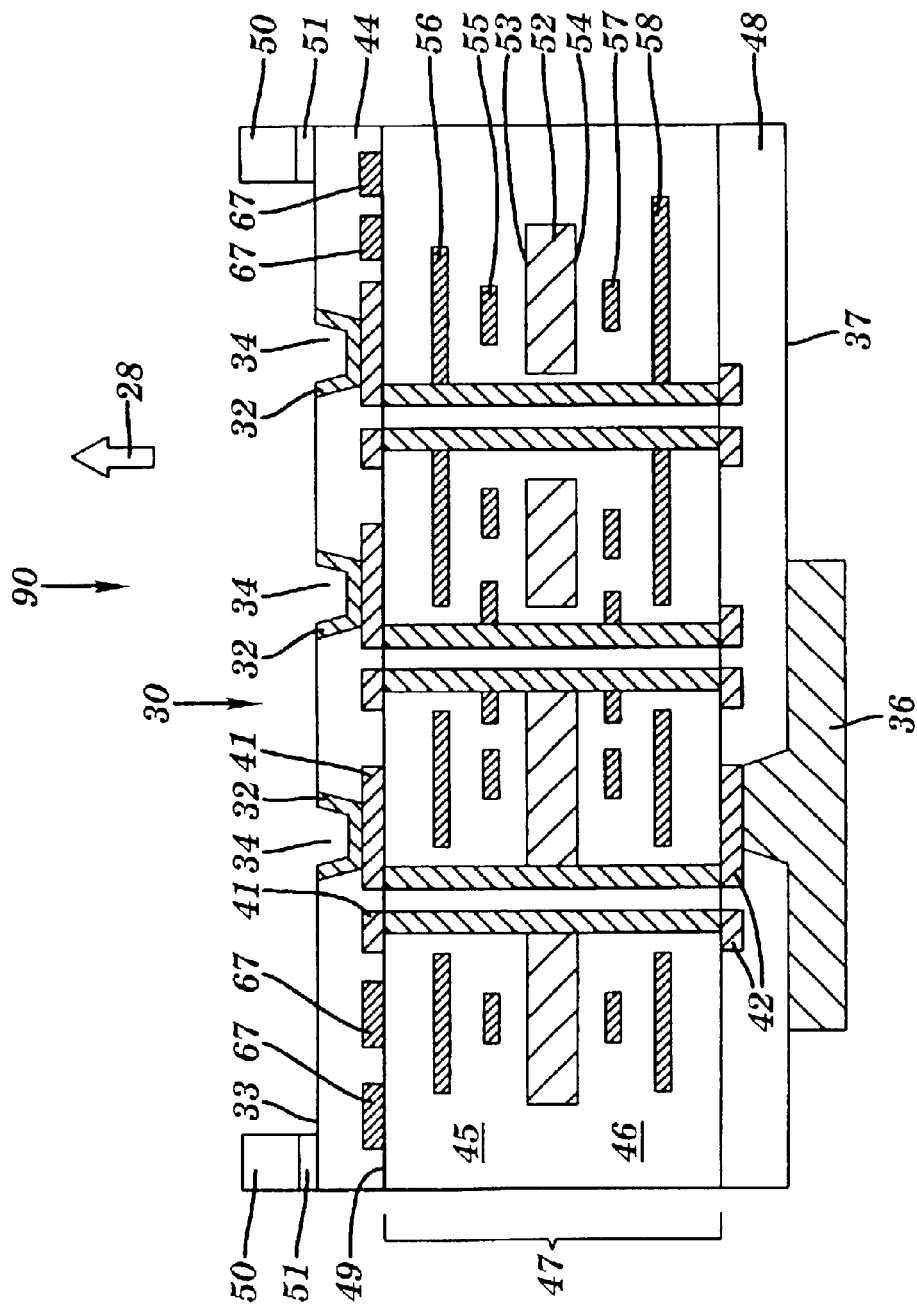
FIG. 11 depicts FIG. 3, showing a metal pattern within an interior portion of the substrate.

FIG. 11 illustrates FIG. 3, showing a metal pattern 67 coupled to a top surface 49 of the dielectric layer 45. The metal pattern 67 may be formed by any method known to one of ordinary skill in the art, such as by the same example method that was described for forming the metal pattern 65 in conjunction with FIG. 9. It should be noted that the metal pattern 67 could be formed concurrent with, and by the same process as, formation of the metal pad 41.

FIGS. 9–11 collectively illustrate that a metal pattern of the present invention (e.g., the metal pattern 65, 66, or 67 of FIG. 9, 10, or 11, respectively) should be positioned "adjacent to" the top surface 33 of the organic substrate 30, wherein "adjacent to" includes being coupled to (e.g., FIGS. 9–10) or being proximate to (e.g., FIG. 11). "Proximate to" means being located at a distance from the top surface 33 than does not exceed the thickness of the dielectric layer 44. As stated supra, the thickness of the dielectric layer 44 is preferably between about 40 microns and about 60 microns.

Figure 12:
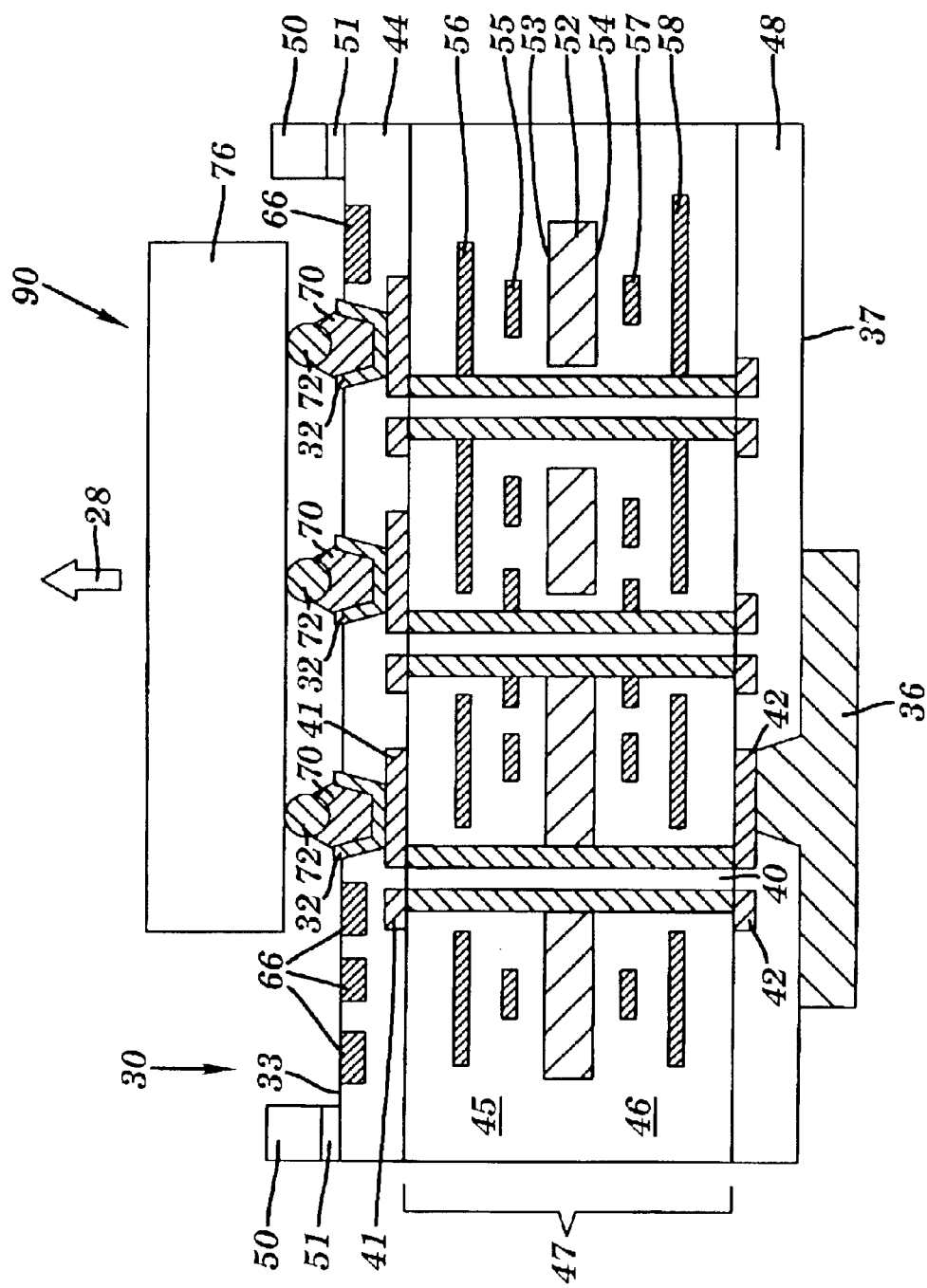
FIG. 12 depicts FIG. 10, after a semiconductor chip has been coupled to the substrate.

FIG. 12 illustrates FIG. 10 after a semiconductor chip 76 has been coupled to the organic substrate 30 by any solderably coupling process known to one of ordinary skill in the art. For example, the plated blind vias 34 (see FIG. 10) may be filled with a solder 70 shown in FIG. 12, and conductive contacts 72 of the semiconductor chip 76 are placed in contact with the solder 70. The solder 70 is thus conductively coupled to the metal structure 32. The solder 70 is then reflowed at a temperature above the melting temperature of the solder 70, and below the melting point of the conductive contacts 72, such that the reflowed solder 70 conductively abuts all conductive contacts 72, and adhesively and conductively couples with all conductive contacts 72 as the reflowed solder 70 cools. Thus at ambient room temperature, the semiconductor chip 76 is conductively coupled to the metal structure 32 at all conductive contacts 72 of the semiconductor chip 76.

In a preferred configuration, the conductive contacts 72 are Controlled Collapse Chip Connection (C4) solder balls comprising solder material having a composition of about 97% lead and about 3% tin with a melting temperature of about 310° C. In the preferred configuration, the solder 70 is a low-melt lead-tin solder with a melting temperature below about 230° C. and at least the melting point of 183° C. of the eutectic composition of about 63% lead and about 37% tin. The solder 70 may have any of various geometric shapes known to those of ordinary skill in the art, such as solder balls and solder columns.

Figure 2:
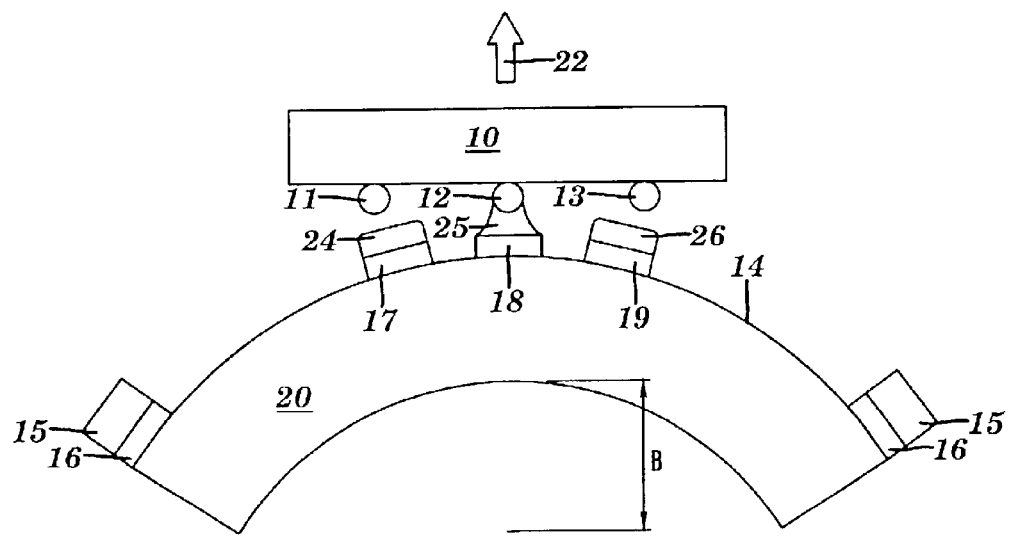
FIG. 2 depicts FIG. 1 after the substrate has been heated to reflow the solder bumps around the solder balls.

If the solder 70 were reflowed, and if the metal pattern 66 were absent, then a thermal expansion mismatch (i.e., $C_2A_2 > C_1A_1$) between the solder structure 36 on the bottom surface 37 and solder structure 32 on the top surface 33 would cause the top surface 33 to bow or bulge upward in the direction 28. The present invention reduces or eliminates the thermal mismatch by adding the metal pattern 66 to satisfy the condition that $(C_2A_2 - C_1A_1 - C_3A_3)$ is less than $(C_2A_2 - C_1A_1)$ in magnitude. $C_2A_2$ and $(C_3A_3 + C_1A_1)$ should differ in magnitude by no more than 20%, and preferably by no more than about 10%. Within the aforementioned 20% magnitude differential between $(C_3A_3 + C_1A_1)$ and $C_2A_2$, and at a reflow temperature between about 183° C. and about 310° C., the present invention is capable of constraining bowing of the substrate 30 to within about 1 mil, and reducing the upward bowing by a factor of at least 2 in comparison with the bowing that would have occurred had the metal pattern 66 not been included (see FIG. 2 and accompanying discussion for a definition of the bowing B). Within the preferred 10% magnitude differential between $(C_3A_3+C_1A_1)$ and $C_2A_2$, and at a reflow temperature between about 183° C. and about 310° C., the present invention is capable of constraining bowing of the substrate 30 to within about ½ mil.

The semiconductor chip 76 in FIG. 12 is generally representative of an electronic device having a plurality of conductive contacts such as the conductive contacts 72. Any such electronic device that could be solderably coupled to the substrate 30 may substitute for the semiconductor chip 76 in FIG. 12.

The metal pattern 66 is electrically insulated from any other conductive structure on or within the substrate 30 and thus does not participate in any electrical conduction functionality of the substrate 30. While the metal pattern 66 is below and coupled to the top surface 33, the metal pattern 66 could be replaced by the metal pattern 65 depicted in FIG. 9 as above and coupled to the top surface 33. Similarly, the metal pattern 66 could be replaced by the metal pattern 67 depicted in FIG. 11. Thus, the semiconductor chip 76 could be coupled to the organic substrate 30 in the configurations of FIGS. 9 and 11 in the same manner as the semiconductor chip 76 could be coupled to the configuration of FIG. 10. Additionally, the metal pattern 66 could have any geometrical shape, such as the geometrical shape of any of the metal patterns 61–64 shown in FIGS. 5–8, respectively.

Stiff Chip Carriers

Figure 1:
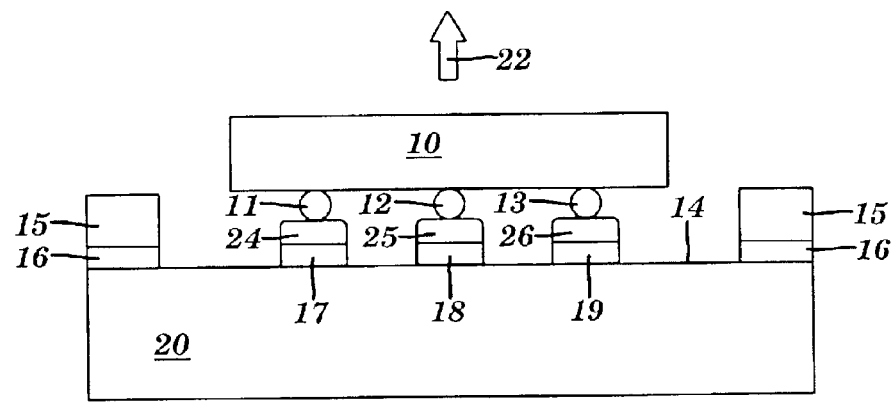
FIG. 1 depicts a front cross-sectional view of a semiconductor chip having solder balls resting on solder bumps of a chip carrier.
Figure 13:
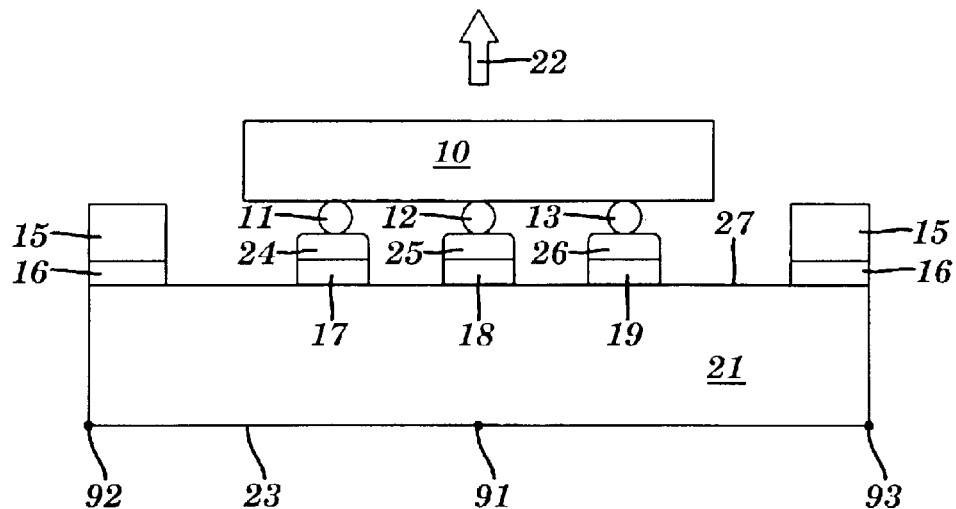
FIG. 13 depicts FIG. 1 with the chip carrier of FIG. 1 being replaced by a stiff chip carrier, and with the stiffener ring coupled to the stiff chip carrier, in accordance with the related art.

FIG. 13 illustrates FIG. 1 with the chip carrier 20 of FIG. 1 being replaced by a stiff chip carrier 21, and with the stiffener ring 15 coupled to the stiff chip carrier 21, in accordance with the related art. A stiff chip carrier is defined herein as a chip carrier having an elastic modulus (also called "flexural modulus") of at least about $3 \times 10^5$ psi. A stiff chip carrier may include, inter alia, one or more epoxy based materials. A stiff chip carrier may include, inter alia, such materials as bismalimide-triazine (BT)-Epoxy/Glass, FR-4 (a common epoxy based dielectric material), a cyanate ester resin, and cyanate ester-epoxy-ePTFE (an expanded teflon material). The stiff chip carrier 21 is limited by its stiffness, or lack of compliancy, to respond to thermally induced strains and is thus at risk for suffering mechanical damage, such as cracking, during thermal cycling as well as during other thermal transients. In FIG. 13, the semiconductor chip 10 is coupled to a central portion of the chip carrier 21, and the stiffener ring 15 is coupled to a peripheral portion of the chip carrier 21. The central portion of the chip carrier 21 is defined as a portion (based on volume or, equivalently, on surface area) of the chip carrier 21 that includes the chip 10 as well as any other semiconductor chips. The peripheral portion of the chip carrier 21 is defined as a portion (based on volume or, equivalently, on surface area) of the chip carrier 21 that does not includes the chip 10 (and any other chips). The peripheral portion of the chip carrier 21 typically occupies about 70% to about 90% of a surface area 27 of the chip carrier 21. As will be explained infra, the stiffener ring 15 is a key factor in the aforementioned thermally induced strains during thermal cycling.

The related art is not aware of this difficulty with the stiffener ring 15. For example, U.S. Pat. No. 6,027,590 (Sylvester et al. February 2000), hereby incorporated by reference, teaches a chip carrier configuration that includes the aforementioned elements (chip carrier, chip, stiffener ring) of FIG. 13. See FIG. 2 of Sylvester showing a chip 18 coupled to a central portion of a chip carrier 12, and a stiffener ring 22 coupled to a peripheral portion of the chip carrier 12. See also FIG. 18 of Sylvester showing a chip 124 coupled to a central portion of a chip carrier 126, and a stiffener ring 130 coupled to a peripheral portion of the chip carrier 126. The chip carrier 12 in Sylvester is stiff, since an elastic modulus of the chip carrier 12 is in a range of $19.4 \times 10^9$ pascals to $26 \times 10^9$ pascals, which converts to the range of $28.1 \times 10^5$ psi to $37.7 \times 10^5$ psi. See Sylvester, col. 12, lines 45–51. The chip carrier 12 in Sylvester includes the materials of bismalimide-triazine (BT)-Epoxy/Glass and cyanate ester-epoxy-ePTFE. See Sylvester, col. 11, lines 37–38. Sylvester identifies an elastic modulus of relevant prior art chip carriers as being in a range of $6.5 \times 10^9$ pascals to $10.3 \times 10^9$ pascals, which converts to the range of $9.42 \times 10^5$ psi to $14.9 \times 10^5$ psi. See Sylvester, col. 12, lines 45–51. Thus, the relevant chip carriers in the prior art are stiff. According to Sylvester, the purpose of the stiffener ring, which "essentially enclos[es] the chip within the [stiffener] ring's center," is to "stiffen the chip and substrate combination." See Sylvester, col. 3, lines 62–67. Additionally in relation Sylvester's invention the "constraining ring 22 stiffens the package 12 to permit easier handling of the package prior to and after chip attachment . . . " See Sylvester, col. 9, lines 18–20. In summary, the related art considers the stiffener ring as serving to further stiffen the already-stiff chip carrier laminate. The Sylvester patent, which issued in February 2000, reflects the state of the art as of February 2000 and earlier.

The related art views the stiffener ring as beneficial for reducing chip carrier flexing at operating temperatures. For example, Sylvester states that "[a] further embodiment of this feature of the invention provides for the insertion of a stiffener in the die area of the substrate to prevent that portion of the substrate from bending relative to the chip mounted directly over that portion of the substrate, through the range of device operating temperatures. So mounted, the stiffener generally overcomes the undesirable substrate warping in the chip die area." See Sylvester, col. 8, lines 4–11. The related art does not appreciate that the stiffener ring significantly increases flexing of the central portion of the chip carrier at a low temperature (e.g. 0° C. to –40° C.) due to a mismatch in a coefficient of thermal expansion (CTE) between the chip and the chip carrier. The chip has a CTE typically in a range of about 2.6 to about 4.1 ppm/° C. The stiff chip carrier has a CTE typically in a range of about 9 ppm/° C. to about 30 ppm/° C. Sylvester's chip carrier has a CTE between 21.4 and 23.0 ppm/° C. See Sylvester, col. 12, lines 45–51. With the stiffener ring in place, a portion of the chip carrier proximate to the stiffener ring (therefore, within the peripheral portion of the chip carrier) cannot flex, or is severely limited in being able to flex, in response to the thermal stress (and consequent strain) induced by the CTE mismatch. Accordingly, the central portion of the chip carrier must accommodate nearly all of the thermal strain induced by the CTE mismatch. Since the chip carrier is very stiff, the central portion of the chip carrier may lack sufficient pliability needed to accommodate the induced thermal stain and is therefore vulnerable to cracking at low temperature. This low temperature effect is important for at least two reasons. A first reason is that thermal cycling for testing purposes may, and typically does, include testing at low temperatures below 0° C. and lower temperatures of the order of –40° C. or less. A second reason is some semiconductor devices normally operate at low temperatures. For example, computer servers are typically cooled below 0° C. (and as low as –15° C.) in order to protect against the damaging effects of substantial heat generation in a computer server electronic environment.

Tests conducted by the inventors of the present invention demonstrate the aforementioned difficulty relating to thermally induced flexing of the chip carrier due to the CTE mismatch. In particular, the tests illustrate the difference in thermally induced flexure between having the stiffener ring in place and not having the stiffener ring. As will be shown infra, the tests demonstrate that the stiffener ring substantially increases the chip carrier flexure and therefore makes the chip carrier more vulnerable to cracking at low temperature.

Figure 14:
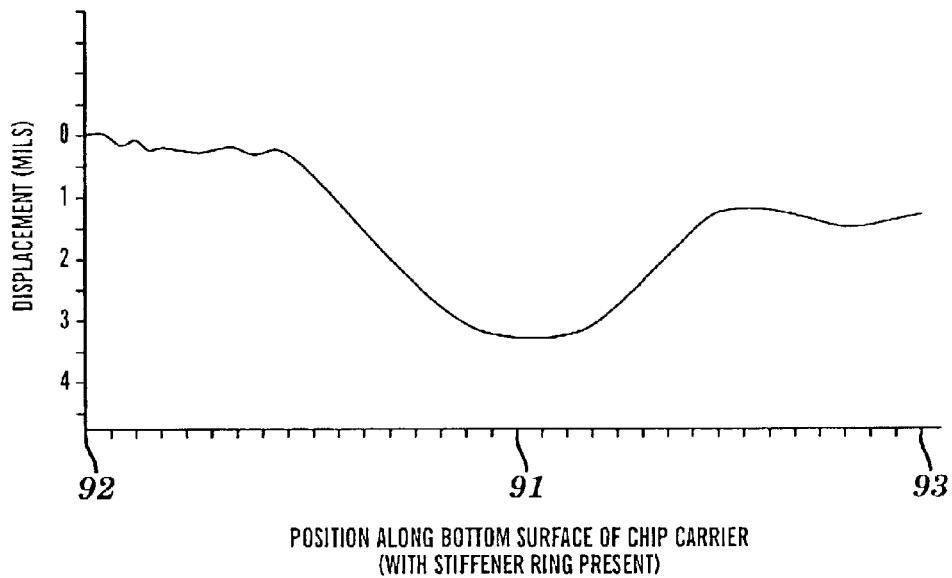
FIG. 14 depicts thermally induced displacement measurements along a bottom surface of the chip carrier of FIG. 13.

FIG. 14 illustrates thermally induced displacement measurements along a bottom surface 23 of the chip carrier 21 of FIG. 13, at ambient room temperature (about 21° C.). The stiffener ring 15 is on the peripheral portion of the chip carrier 21. The bottom surface 23 may be subsequently coupled to a circuit card by any applicable conductive coupling structure such as a ball grid array (BGA) conductive coupling structure. In relation to the measurements, the chip carrier 21 of FIG. 13 is square with a height of 1.29 mm in the direction 22 and dimensions of 42.5 mm×42.5 mm normal to the direction 22, the stiffener ring 15 and adhesive 16 have a combined height of 0.73 mm in the direction 22 and a thickness of 10 mm normal to the direction 22, and the chip 10 has dimensions of 18.5 mm×18.5 mm normal to the direction 22. Thus in relation to the measurements, the stiffener ring 15 occupies about 47% of an area of the top surface 27 of the chip carrier 21. The chip 10 was attached to the chip carrier 21 at a reflow temperature of about 240° C., and the bottom surface 23 was essentially flat at the reflow temperature. A consequent displacement along the bottom surface 23 occurred at ambient room temperature of about 21° C. because of thermal contraction of the chip carrier 21 under a mismatch in CTE between the chip 10 and the chip carrier 21, in combination with the high stiffness of the chip carrier 21 which resists the thermal expansion. In relation to the measurements, the chip 10 had a CTE of about 3 ppm/° C., and the chip carrier 21 had a CTE of about 18 ppm/° C. FIG. 14 shows a maximum displacement of about 3.5 mils at a center point 91 of the bottom surface 23, and relatively smaller displacement at peripheral points 92 and 93 of the bottom surface 23. The high maximum displacement of about 3.5 mils at the center point 91 is due to the constraining effect of the stiffener ring 15 on chip carrier 21 material in the peripheral portion of the chip carrier 21 (especially under the stiffener ring 15), which forces the chip carrier 21 material in the central portion of the chip carrier 21 to be increasingly displaced in order to accommodate the thermal stresses. The negligible displacement at peripheral edges of the bottom surface 23 is due to a constraining effect of the stiffener ring 15 on peripheral portions of the chip carrier 21 where the stiffener ring 15 is mechanically coupled to the chip carrier 21. Interestingly, a key feature of the stiffener ring 22 in Sylvester is its constraining functionality (see Sylvester, col. 9, line 14, where the stiffener ring 22 is actually labeled as a "constraining ring."). The differential displacement between the center and the peripheral portions of the bottom surface 23, places significant stress on the chip carrier 21 because the chip carrier 21 is very stiff (i.e., the elastic modulus of the chip carrier 21 is of the type described by Sylvester in U.S. Pat. No. 6,027,590, col. 12, lines 45–51, and is thus in the range of $9.42 \times 10^5$ psi to $14.9 \times 10^5$ psi as discussed supra) and lacks sufficient pliability needed for accommodating the resultant thermal strains. The stress on the chip carrier 21 is even more problematic if the temperature is lowered. For example, if during thermal cycling the chip carrier 21 is subjected to low temperatures (e.g., below about 0° C.), then the displacement along the bottom surface 23 increases. In particular at about −40° C., the maximum displacement of about 3.5 mils in FIG. 14 increases to about 5 mils, which makes the chip carrier 21 highly vulnerable to mechanical weakening and cracking.

Figure 15:
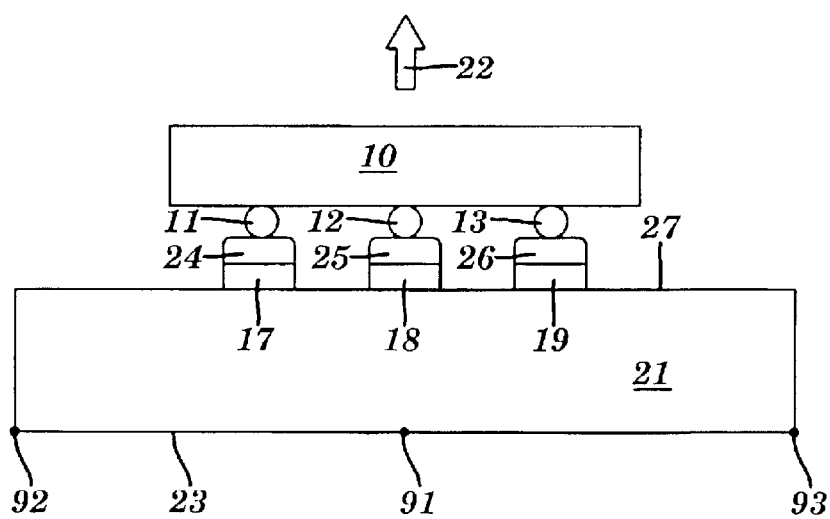
FIG. 15 depicts FIG. 13 with the stiffener ring removed, in accordance with embodiments of the present invention.

FIG. 15 depicts FIG. 13 with the stiffener ring 15 removed, in accordance with embodiments of the present invention. With the stiffener ring 15 removed, the chip carrier 21 is able to undergo "natural" flexing (i.e., be in a state of natural flexure) in response to thermal stresses caused by CTE differences between the chip 10 and the chip carrier 21 when the temperature of the chip carrier 21 is depressed. In particular, the bottom surface 23 in FIG. 15 is able to undergo "natural" flexing in response to said thermal stresses. Natural flexing is defined as flexing that is not limited by a constraining structure coupled to the chip carrier 21 within a peripheral portion of the chip carrier 21. An example of a constraining structure is the stiffener ring 15 of FIG. 13.

Returning to FIG. 15 wherein there is no stiffener ring on said peripheral portion of the top surface 27, a peripheral portion of the top surface 27 of the chip carrier 21 is essentially exposed. The peripheral portion of the top surface 27 is "essentially exposed" (as opposed to "totally exposed"), because additional structure such as solder joints or circuitization may cover a small percentage of a surface area of the peripheral portion of the top surface 27, wherein the additional structure covers only a small portion (e.g., about 1%) of the peripheral portion of the top surface 27, and thus leaves most of the surface area (e.g., about 99%) of the peripheral portion of the top surface 27 exposed. In contrast, the stiffener ring in the tests of FIG. 14 covers a much larger percentage (e.g., about 85% to about 90%) of the peripheral portion of the top surface 27. Note that "essentially exposed" includes "totally exposed" (i.e., 100% exposed) as a special case.

Figure 16:
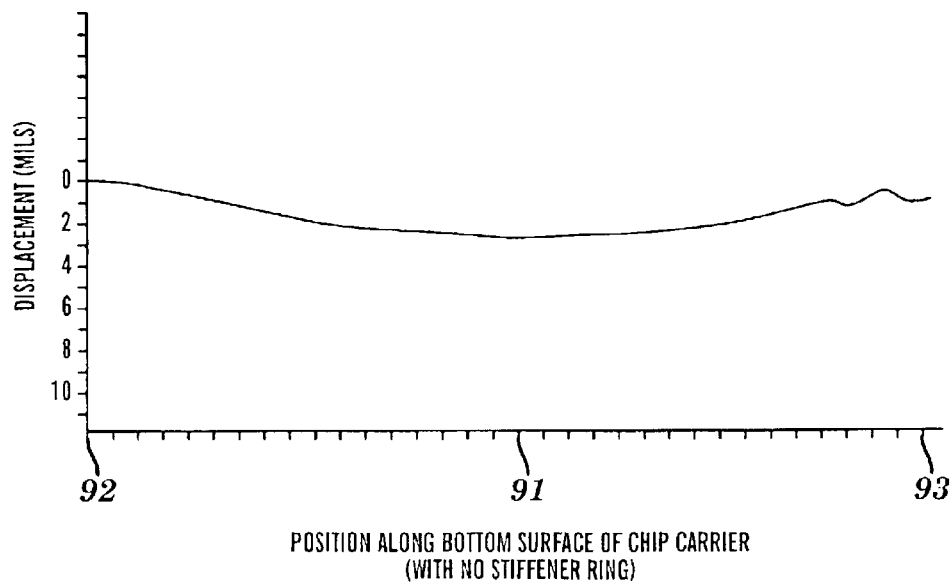
FIG. 16 depicts thermally induced displacement measurements along a bottom surface of the chip carrier of FIG. 15.

FIG. 16 depicts thermally induced displacement measurements along a bottom surface of the chip carrier of FIG. 15, at ambient room temperature of about 21° C., wherein the chip carrier configuration with respect to structure, geometry, materials, etc. is the same as that the chip carrier configuration relating to FIG. 14. There is no stiffener ring on the chip carrier 21. FIG. 16 shows a maximum room-temperature displacement of about 2.0 mils at about the center point 91 of the bottom surface 23 of the chip carrier 21, which represents about a 43% reduction in maximum displacement relative to the displacement (3.5 mils) for the stiffener ring 15 configuration associated with FIG. 14 at room temperature of about 21° C. If during thermal cycling, the chip carrier 21 is subjected to the low temperature of about −40° C., the maximum displacement of about 2.0 mils in FIG. 16 would increase to about 2.5 mils, which represents about a 50% reduction in maximum displacement relative to the displacement (5.0 mils) in the stiffener ring 15 configuration associated with FIG. 14 at −40° C. Hence, removal of the stiffener ring 15 beneficially reduced the chip carrier 21 flexing by up to about 50%. The numerical percent reduction in maximum displacement is case dependent, and depends particularly on the elastic modulus of the chip carrier 21, the CTE mismatch between the chip carrier 21 and the chip 10, and the geometry of the mechanical interface between the stiffener ring 15 and the chip carrier 21. Generally with current technology and in consideration of the aforementioned case-dependent factors, the percent reduction in maximum displacement resulting from removing the stiffener ring 15 is at least about 25% if the temperature at the chip carrier changes from ambient room temperature of about 21° C. to a temperature of about −40° C. Thus, by teaching removal of the stiffener ring 15 (i.e., not having a stiffener ring 15 on the chip carrier 21 top surface 27), the present invention provides a structure and method that substantially reduces maximum displacements of the bottom surface 23 of the chip carrier 21 and consequently reduces a probability of chip carrier cracking in stiff chip carriers, particularly at low temperatures between about 0° C. and about −40° C.

Another advantage of avoiding use of the stiffener ring 15 on the chip carrier 21 relates to conductive wiring (e.g., copper wiring) on the top surface 27, or the bottom surface 23, of the chip carrier 21. A ductility of the conductive wiring assists the conductive wiring in withstanding thermally induced displacements on the top surface 27, or the bottom surface 23, respectively. An ability of the conductive wiring to so withstand the thermally induced displacements diminishes as the magnitude of the thermally induced displacements increases. Thus, by reducing the magnitude of the thermally induced displacements, the stiff chip carrier 21 that is free of the stiffener ring 15 helps to prevent structural damage (e.g., cracking) of the conductive wiring under conditions of thermally induced displacements in the chip carrier 21. Thus, with the stiff chip carrier 21 free of the stiffener ring 15 and thus capable of being in a state of natural flexure, the conductive wiring is better able to maintain its structural integrity under thermally induced displacements of the chip carrier 21 than if than if the chip carrier 21 were unable to be in a state of natural flexure.

A chip carrier may have an isotropic CTE when its temperature is above its glass transition temperature (GTT). The GTT is a temperature at which amorphous domains of a polymer takes on characteristic properties of glassy state-brittleness, stiffness, and rigidity. At the GTT, the solid, glassy polymer begins to soften and flow. An isotropic CTE is characterized by thermal expansion or contraction at a rate that is independent of a direction of the thermal expansion or contraction. If the chip carrier 21 has an isotropic CTE when its temperature is above its GTT, then presence of the stiffener ring 15 would inhibit thermal expansion or contraction to an extent that the chip carrier 21 might crack in its inability to accommodate the thermally-induced strain. In contrast, an absence of the stiffener ring 15 would enable the chip carrier 21 to avoid structural damage by its ability to expand naturally in response to the thermally-induced strain.

While the chip carrier 21 of the present invention has been depicted in the embodiments herein as not being coupled to the stiffener ring 15, the scope of the present invention includes having the chip carrier 21 free of any constraining structure coupled to the peripheral portion of the chip carrier 21. As explained infra in conjunction with FIG. 15, a constraining structure prevents the chip carrier 21 from being in a state of natural flexure in response to thermal stresses caused by the difference in the CTE of the chip carrier and the CTE of the chip.

While preferred and particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A method of forming an electronic structure, comprising:

providing a chip carrier having an elastic modulus of at least about $3 \times 10^5$ psi, wherein there is no stiffener ring coupled to a peripheral portion of the chip carrier; and coupling a semiconductor chip to a central portion of the chip carrier, wherein the semiconductor chip has a coefficient of thermal expansion (CTE) of $C_1$, wherein the chip carrier has a CTE of $C_2$, wherein $C_2 > C_1$, and wherein the chip carrier is able to undergo natural flexing in response to thermal stresses caused by a difference between $C_2$ and $C_1$.

2. The method of claim 1, wherein the peripheral portion of the chip carrier is essentially exposed, and wherein the peripheral portion of the chip carrier includes about 70% to 90% of the surfaces area of a surface of the chip carrier.

3. The method of claim 1, wherein the chip carrier includes an epoxy based material.

4. The method of claim 1, wherein the chip carrier includes a material selected from the group consisting of bismalimide-triazine (BT)-Epoxy/Glass, a cyanate ester resin, cyanate ester-epoxy-ePTFE, and combinations thereof.

5. The method of claim 4, further comprising forming conductive wiring on a surface of the chip carrier, wherein the surface is selected from the group consisting of a top surface, a bottom surface, and a combination thereof, and wherein the conductive wiring is better able to maintain its structural integrity under a thermally induced displacement of the chip carrier than if the stiffener ring were present.

6. The method of claim 1, further comprising forming conductive wiring on a surface of the chip carrier, wherein the surface is selected from the group consisting of a top surface, a bottom surface, and a combination thereof, and wherein the conductive wiring is better able to maintain its structural integrity under a thermally induced displacement of the chip carrier than if the stiffener ring were present.

7. The method of claim 1, further comprising subjecting the chip carrier to the thermal stresses caused by the difference between $C_2$ and $C_1$, resting in natural flexing of the chip carrier.

8. The method of claim 7, wherein subjecting the chip carrier to the thermal stresses caused by the difference between $C_2$ and $C_1$ includes subjecting the chip carrier to a temperature in a range of about 21° C. to about −40° C., resulting in a surface of the chip carrier being maximally displaced by at least about 25% less than if the stiffener ring were coupled to the peripheral portion of the chip carrier.

9. The method of claim 7, wherein the chip carrier includes a material selected from the group consisting of bismalimide-triazine (BT)-Epoxy/Glass, a cyanate ester resin, cyanate ester-epoxy-ePTFE, and combinations thereof.

10. The method of claim 7, wherein the chip carrier has an isotropic coefficient of thermal expansion (CTE) at a temperature above the glass transition temperature (GTT) of the chip carrier.

11. A method of forming an electronic structure, comprising:

providing a chip carrier having an elastic modulus of at least about $3 \times 10^5$ psi, wherein there is no stiffener ring coupled to a peripheral portion of the chip carrier; and coupling a semiconductor chip to a central portion of the chip carrier, wherein the chip carrier has an isotropic coefficient of thermal expansion (CTE) at a temperature above the glass transition temperature (GTT) of the chip carrier.

12. The method of claim 11, further comprising subjecting the chip carrier to a temperature that is above the GTT.

13. The method of claim 11, further comprising forming conductive wiring on a surface of the chip carrier, wherein the surface is selected from the group consisting of a top surface, a bottom surface, and a combination thereof, and wherein the conductive wiring is better able to maintain its structural integrity under a thermally induced displacement of the chip carrier than if the stiffener ring were present.

14. The method of claim 11, further comprising subjecting the chip carrier to a temperature that is above the GTT.

15. A method of forming an electronic structure, comprising:

provffding a chip carrier having an elastic modulus of at least about $3 \times 10^5$ psi, wherein there is no stiffener ring coupled to a peripheral portion of the chip carrier, wherein the peripheral portion of the chip carrier includes about 70% to 90% of the surfaces area of a surface of the chip carrier; and coupling a semiconductor chip to a central portion of the chip carrier.

16. The method of claim 15, wherein the chip carrier includes an epoxy based material.

17. The method of claim 15, wherein the chip carrier has an isotropic coefficient of thermal expansion (CTE) at a temperature above the glass transition temperature (GTT) of the chip carrier.

18. The method of claim 17, further comprising forming conductive wiring on a surface of the chip carrier, wherein the surface is selected from the group consisting of a top surface, a bottom surface, and a combination thereof, and wherein the conductive wiring is better able to maintain its structural integrity under a thermally induced displacement of the chip carrier than if the stiffener ring were present.

19. The method of claim 15, wherein the chip carrier includes a material selected from the group consisting of bismalimide-triazine (BT)-Epoxy/Glass, a cyanate ester resin, cyanate ester-epoxy-ePTFE, and combinations thereof.

20. The method of claim 19, further comprising forming conductive wiring on a surface of the chip carrier, wherein the surface is selected from the group consisting of a top surface, a bottom surface, and a combination thereof, and wherein the conductive wiring is better able to maintain its structural integrity under a thermally induced displacement of the chip carrier than if the stiffener ring were present.

* * * * *